(12) United States Patent
Muthalif et al.

(10) Patent No.: US 7,315,806 B2
(45) Date of Patent: Jan. 1, 2008

(54) ENHANCED NEGATIVE CONSTRAINT CALCULATION FOR EVENT DRIVEN SIMULATIONS

(75) Inventors: Abdul MJ Muthalif, Bangalore (IN); Raghavendra N Rao, Bangalore (IN); Javaji Sunil Babu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 598 days.

(21) Appl. No.: 10/850,668

(22) Filed: May 20, 2004

(65) Prior Publication Data

US 2005/0189976 A1 Sep. 1, 2005

Related U.S. Application Data

(60) Provisional application No. 60/548,687, filed on Feb. 27, 2004.

(51) Int. Cl.
*G06F 17/50* (2006.01)

(52) U.S. Cl. .............................. 703/19; 703/16; 703/17

(58) Field of Classification Search ............ 703/16–17, 703/19

See application file for complete search history.

(56) References Cited

OTHER PUBLICATIONS

IEEE Standard for VITAL Application-Specific Integrated Circuit (ASIC) Modeling Specification; 1995; pp. 10, 19, 34-36, 53-56.*

* cited by examiner

*Primary Examiner*—Hugh Jones
(74) *Attorney, Agent, or Firm*—Alan K. Stewart; W. James Brady; Frederick J. Telecky, Jr.

(57) ABSTRACT

A technique to enable accurate timing and functional verification in a negative constraint calculation (NCC) implemented event-driven logic simulators when there are negative constraints in logic elements. In one example embodiment, the technique adjusts negative timing constraints by grouping the timing constraints based on associated output terminals in a digital logic circuit. The NCC is then applied to each grouped constraint to correct for path delays and resulting timing inaccuracy during an event driven simulation.

5 Claims, 4 Drawing Sheets

US 7,315,806 B2

ENHANCED NEGATIVE CONSTRAINT CALCULATION FOR EVENT DRIVEN SIMULATIONS

This application claims priority under 35 USC § 119 (e)(1) of provisional application No. 60/548,687, filed Feb. 27, 2004.

TECHNICAL FIELD OF THE INVENTION

The present invention relates generally to integrated circuits, and more particularly relates to integrated circuit design verification by simulators.

BACKGROUND OF THE INVENTION

A common memory element used in integrated circuits is referred to as a "flip-flop". A flip-flop is a circuit that can maintain a binary state indefinitely (as long as power is applied to the integrated circuit) until directed by an input signal to switch states. The flip-flop switches can switch state in response to, for example, a rising edge of a clock signal (i.e., when the clock signal changes from 0 (low) to 1 (high) or vice-versa).

In general, the flip-flop stores a received data signal at the input terminal during a rising edge of a clock signal. In order for the stored data to be propagated to the output terminal of the flip-flop, the received data signal needs to be stabilized at the input terminal, referred to as setup time 'ts', before the clock signal is received at the flip-flop. Similarly, it is also necessary for the data signal to be stabilized at the input terminal for a further time period, referred to as 'th', after the clock signal is received. The sum of the setup and hold times ts and th defines a time period, referred to as a "constraint window" during which the data signal must be stabilized at either 0 or 1. For similar reasons, the data signal has to be stable during the constraint window for the flip-flop to capture and output the data signal to the output terminal. Therefore, the generated output data signal at the output terminal appears after a delay from a clock positive edge. This time delay is generally referred to as CLK-to-Q propagation delay of the flip-flop.

Generally, the setup time ts, hold time th, and CLK-to-Q propagation delay of a flip-flop vary depending on the flip-flop design. Also, setup time ts and hold time th can be negative depending on the design of the flip-flop. A typical implementation of the flip-flop can have a negative setup time, if it has a long route for a clock signal. The hold time th can be negative if it has a long route for a data signal. In either case, the sum of the setup time ts and hold time th will be positive.

Typically, digital circuits are verified for desired operation by performing a logic simulation using a hardware description language (HDL), such as Verilog or a Very high speed integrated circuit hardware description language (VHDL). The logic simulators simulate a digital circuit by creating events in time for every change in the logic value of nodes in the digital circuit. For expected simulation results, generally the events have to be evaluated in a proper sequence.

In such situations, logic simulators implement a negative constraint calculation (NCC) using an NCC algorithm to overcome the simulation inaccuracy when simulating elements having negative constraints. The current NCC algorithms simulate the original layout route delays by adding delay elements to the data and clock input terminals D and CLK. However, if the applied CLK-to-Q propagation delay is less than the delay applied to the input clock signal, i.e., having a negative setup time ts of magnitude greater than CLK-to-Q propagation delay, then the adjusted CLK-to-Q propagation delay can be negative. The negative CLK-to-Q propagation delay means that the outputted data signal appears before the input data signal occurs. Since this cannot be simulated, the NCC algorithm zeros out the CLK-to-Q propagation delay. When the NCC algorithm zeros out the CLK-to-Q propagation delay the simulated path delay will be set to "ts" (which is the delay applied onto the input clock signal), and hence results in an inaccurate CLK-to-Q propagation delay. In such conditions, the NCC algorithm fails to adjust negative constraints as expected. This can result in larger path delays and which can in-turn result in affecting the timing accuracy during an event driven simulation of a digital logic circuit.

SUMMARY OF THE INVENTION

The present invention provides an enhanced negative constraint calculation (NCC) algorithm for an event driven simulation. The enhanced NCC algorithm enables accurate timing and functional verification for NCC implemented event-driven logic simulators. In one example embodiment, the technique adjusts timing constraints by grouping the timing constraints based on associated output terminals in a digital logic circuit. The enhanced NCC algorithm then replaces all negative constraints with positive constraints by applying the NCC to each grouped constraint to correct for path delays and duty cycle distortions during the event driven simulation of the digital logic circuit.

DETAILED DESCRIPTION OF THE INVENTION

The present subject matter provides an enhanced NCC algorithm for event driven simulation, which can require adjusting of negative constraints in logic elements. In one example embodiment, the algorithm groups timing constraints based on associated output terminals in a digital logic circuit. The enhanced NCC algorithm then applies the NCC to each grouped constraint to adjust found negative constraints to correct path delays and in-turn improves the timing accuracy during an event driven simulation.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
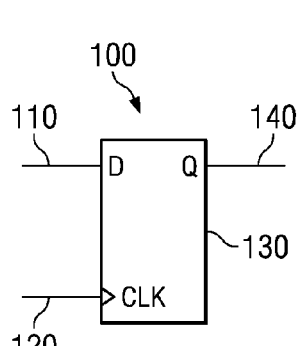
FIG. 1 is a block diagram illustrating a flip-flop.

FIG. 1 is a block diagram 100 showing a flip-flop 130. As shown in FIG. 1, the flip-flop 130 includes a data input terminal D, a clock input terminal CLK, and an output terminal Q. The flip-flop 130 receives a data signal 110 at D, a clock signal 120 at CLK, and outputs a data signal 140 at Q. The flip-flop 130 typically stores the data signal 110 received at the data input terminal D during a rising edge of the clock signal 120 received at the clock input terminal CLK.

Figure 2:
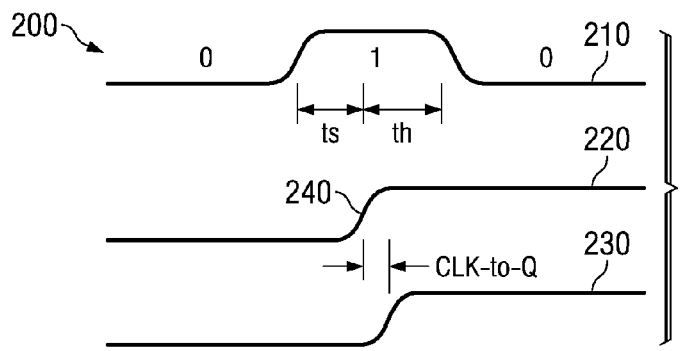
FIG. 2 is a timing diagram showing setup and hold times in a flip-flop.

FIG. 2 is a timing diagram 200 showing an input data signal 210, an input clock signal 220, and an output data signal 230 generated during a typical operation of the flip-flop 130 (shown in FIG. 1). As shown in FIGS. 1 and 2, for unambiguous data to be propagated to the terminal Q, the data signal 210 for example 1, needs to be stabilized at the data input terminal D for a time period ts, before the clock signal transition 240 is received at the input terminal CLK. Similarly, it is also necessary for the data signal 1 to be stabilized at the data input terminal D for a further time period th, after the clock signal 240 is received. Similarly as shown in FIG. 2, the data signal 1 has to be stable during the constraint window for the flip-flop 130 to capture the data 1 and output the data signal 1 to the output terminal Q. As shown in FIG. 2, the generated output data signal 230 at the output terminal Q appears after a propagation delay CLK-to-Q from a clock positive edge 240.

Figure 3:
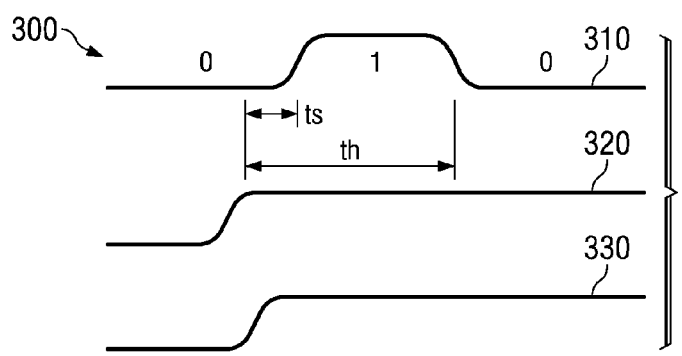
FIG. 3 is a timing diagram showing CLK-to-Q propagation delay in a flip-flop.

A typical implementation of the flip-flop can have a negative setup time, if it has a long route for a clock signal. The hold time th can be negative if it has a long route for a data signal. In either case, the sum of the setup time ts and hold time th will be positive. FIG. 3 shows a timing diagram 300 of a typical scenario of data and clock signals 310 and 320 generated when there is a negative setup (when a flip-flop has a negative ts). However, in such situations the constraint window generally remains positive as shown in FIG. 3. Also, shown in FIG. 3 is the outputted data signal 330.

Typically, digital circuits are verified for desired operation by performing a logic simulation. For expected simulation results, generally the events have to be evaluated in a proper sequence. For example, when the setup time ts and hold time th are both positive, the data at the data input terminal D, i.e. logic 1, appears before the rising edge of the generated clock signal 220 as shown in FIGS. 1 and 2. The order of events of the generated input data signal 210, input clock signal 220, and the output data signal 230 are such that the expected value of data 1 is seen at the output terminal Q when the positive edge of the generated input clock signal is evaluated. Thus, the performed simulation results in storing logic 1 in the flip-flop 130 and outputting on to the output terminal Q.

Similarly, for example, as shown in FIG. 3, when the setup time ts is negative and the hold time th is positive, the event of "positive edge", i.e., the rising edge 240 of the generated input clock signal 220 (shown in FIG. 2) appears first and the data at the data input terminal D will be at logic 0. Thus, the simulation results in the logic 0 being stored in the flip-flop 130 and outputted to the output terminal Q. The desired data, i.e., logic 1 event happens subsequent to the event of the "positive edge" on the input clock signal 220 and hence results in the data of logic 1 not being stored and ending in an unexpected simulation result.

Figure 4:
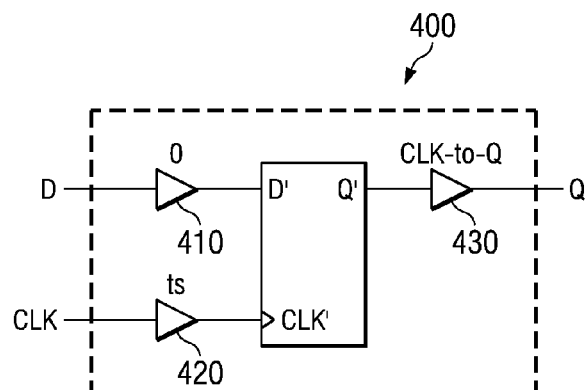
FIG. 4 is a block diagram illustrating implementation of CLK-to-Q propagation delay as a buffer at the output terminal Q of a flip-flop.
Figure 5:
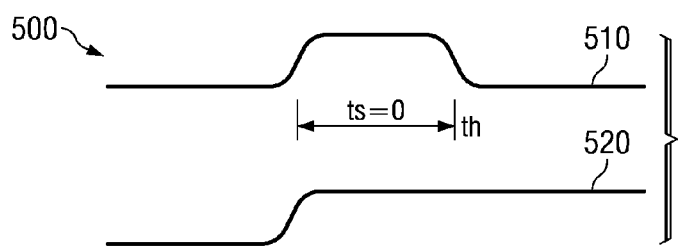
FIG. 5 is a timing diagram showing adjusted setup and CLK-to-Q propagation delay times in a flip-flop.

In such situations, logic simulators implement a negative constraint calculation (NCC) using an NCC algorithm to overcome the simulation inaccuracy when simulating elements having negative constraints. The NCC algorithms simulate the original layout route delays by adding delay elements to the data and clock input terminals D and CLK. FIG. 4 shows a block diagram 400 of implementing the delay elements, buffers 410 and 420 and CLK-to-Q propagation delay 430, i.e., adding delay elements, at the input terminal D, input clock terminal CLK, and output terminal Q. The resulting timing diagram 500 is shown in FIG. 5. As shown in FIG. 5, the order of events on the data and clock input signals 510 and 520 are corrected and results in an expected simulation, i.e., the logic 1 is stored in the flip-flop 130 (shown in FIG. 1) and outputted to the data output terminal Q. Since the input clock signal 520 is delayed by 'ts' time units, the outputted data signal 530 at the output terminal Q appears after a time of (CLK-to-Q+"ts") from the positive edge of the input clock signal 520. This results in an inaccurate clock-to-Q propagation delay. Therefore, the NCC algorithm also adjusts the CLK-to-Q propagation delay by subtracting the delay on the input clock signal 520 that is "ts" from CLK-to-Q propagation delay as shown in FIG. 5. After performing the above time delay corrections by the NCC algorithm, the simulation results are, function-wise and timing wise, as expected.

However, if the applied CLK-to-Q propagation delay is less than the delay applied to the input clock signal, i.e., having a negative setup time ts of magnitude greater than CLK-to-Q propagation delay, then the adjusted CLK-to-Q propagation delay can be negative. The negative CLK-to-Q propagation delay means that the outputted data signal appears before the input data signal occurs. Since this cannot be simulated, the NCC algorithm zeros out the CLK-to-Q propagation delay. When the NCC zeros out the CLK-to-Q propagation delay the simulated path delay will be set to "ts" (which is the delay applied onto the input clock signal), and hence results in an inaccurate CLK-to-Q propagation delay. In such conditions, the NCC algorithm fails to adjust negative constraints as expected.

Figure 6:
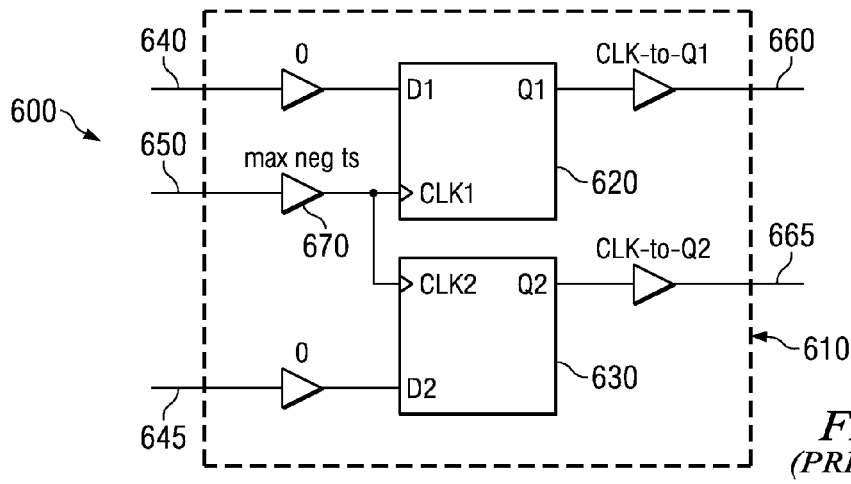
FIG. 6 is a block diagram illustrating incorrect implementation of path delays, of a negative constraint calculation (NCC) during an event driven simulation, in a digital logic circuit.

FIG. 6 is a block diagram 600 showing an implementation of path delays, by a negative constraint calculation (NCC) technique, to a digital logic circuit 610 during an event driven simulation. As shown in FIG. 6, the digital logic circuit 610 includes flip-flops 620 and 630. Each of the flip-flops 620 and 630 include data input terminals D1 and D2, clock input terminals CLK1 and CLK2, and output terminals Q1 and Q2, respectively. The flip-flops 620 and 630 receive data signals 640 and 645 at D1 and D2, clock signal 650 at CLK1 and CLK2, and output signals 660 and 665 at Q1 and Q2, respectively. The flip-flops 620 and 630 store the data signals 640 and 645 received at the data input terminals D1 and D2 during rising edges of the clock signal 650 received at the clock input terminals CLK1 and CLK2, respectively. The block diagram 600 of FIG. 6 shows application of a delay element having a delay of largest negative setup constraint value (negative setup) 'max neg ts' 670 to clock signal 650 received at both the clock input terminals CLK1 and CLK2 which results in an unexpected implementation of path delays.

The following illustrates, using example time delays and constraints, the unexpected implementation of path delays by the above technique during an event driven simulation of the digital logic circuit 610 shown in FIG. 6:

When ts (D1-CLK) is equal to 4 time units, th (D1-CLK) is equal to 7 time units, ts (D2-CLK) is equal to −6 time units, th (D2-CLK) is equal to 14 time units, CLK-to-Q1 propagation delay is equal to 5 time units, and CLK-to-Q2 propagation delay is equal to 15 time units, the NCC technique adds a delay equal to a maximum negative setup on CLK, which is equal to 6 time units. This added delay results in adjusting the time delays and constrains as follows:

ts (D1-CLK)=4+6=10
th (D1-CLK)=7−6=1
ts (D2-CLK)=−6+6=0
th (D2-CLK)=14−6=8
CLK-to-Q1 propagation delay=5−6=−1=>0
CLK-to-Q2 propagation delay=15−6=9

It can be seen from the above adjusted time and path delays, that the CLK-to-Q1 propagation delay results in simulating an incorrect path delay of 6 time units instead of the required 5 time units.

The following illustrates, by using the example time delays and constraints, another incorrect implementation, i.e., the duty-cycle distortion, resulting from the application of the NCC technique to the digital logic circuit 610, shown in FIG. 6, during an event driven simulation.

When the characterized constraints and delays are:
ts (D1-CLK)=4
th (D1-CLK)=7
ts (D2-CLK)=−6
th (D2-CLK)=14
CLK-to-Q1 propagation delay=5 (rising), 6 (falling)
CLK-to-Q2 propagation delay=15

It can be seen in the above example that the CLK-to-Q rising and CLK-to-Q2 falling propagation delays for the outputs Q1 and Q2 are different. After applying the NCC technique, the adjusted constraints and path delays are as follows:

ts (D1-CLK)=4+6=10
th (D1-CLK)=7−6=1
ts (D2-CLK)=−6+6=0
th (D2-CLK)=14−6=8
CLK-to-Q1 propagation delay=5−6=−1=>0 (rising)
CLK-to-Q1 propagation delay=6−6=0 (falling)
CLK-to-Q2 propagation delay=15−6=9

Figure 7:
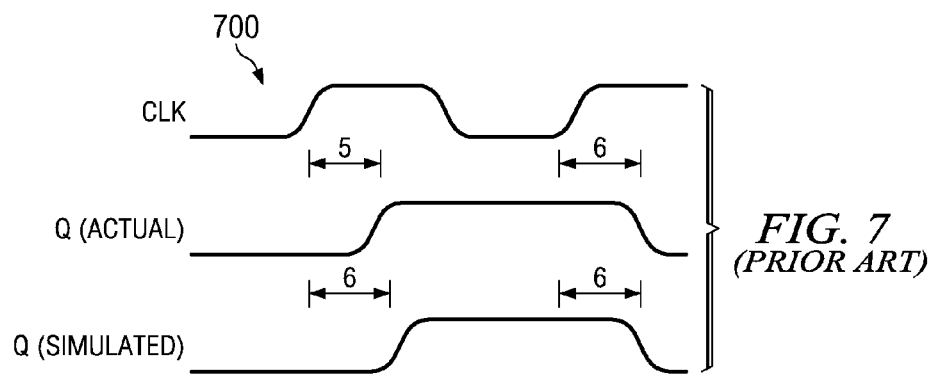
FIG. 7 is a timing diagram showing occurrence of a duty-cycle distortion, during an event driven simulation of the digital logic circuit of FIG. 6, when the CLK-to-Q rising and CLK-to-Q falling propagation delays are different.

It can be seen from the above adjusted constraints and the path delays that the adjusted CLK-to-Q1 simulates a propagation delay of 6 time units instead of the required 5 time units for the rising output on Q1. Therefore, applying the NCC technique, to the digital logic circuit 610, results in an incorrectly simulated propagation time delay of 6 time units. This in-turn results in a distorted duty-cycle at the output on Q1 as shown in the timing diagram 700 of FIG. 7. Also, it can be seen in FIG. 7 that the simulated delays cause the length of logic '1' pulse to be lesser by 1 time unit.

Figure 8:
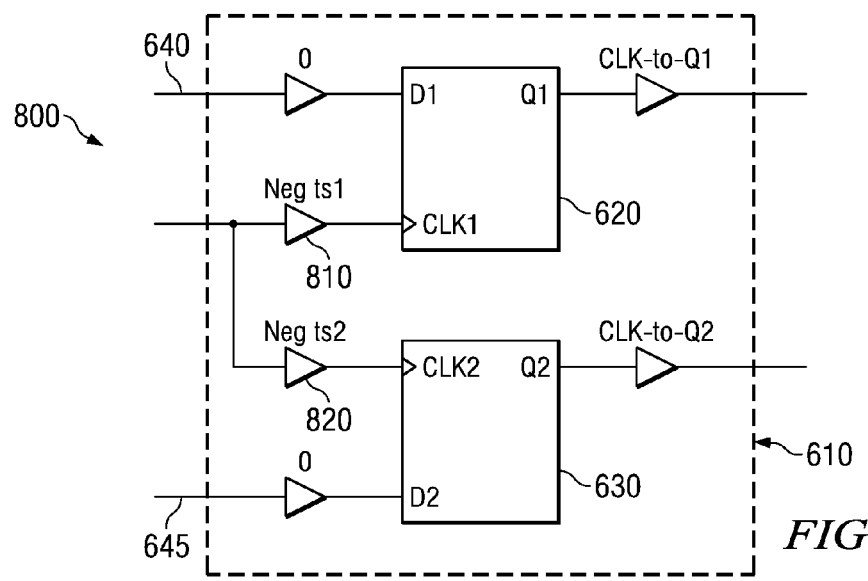
FIG. 8 is a block diagram illustrating an example implementation of buffers to the digital logic circuit of FIG. 6 according to embodiments of the present invention.

FIG. 8 is a block diagram 800 illustrating an example implementation of delay elements, i.e., buffers, neg ts1 and neg ts2, during an event driven simulation to the digital logic circuit 610 using the enhanced NCC algorithm to alleviate the incorrect application of path delays and duty delay distortion problems described with reference to the above examples. As shown in FIG. 8, the digital logic circuit 610 includes the flip-flops 620 and 630. Each of the flip-flops 620 and 630 include data input terminals D1 and D2, clock input terminals CLK1 and CLK2, and output terminals Q1 and Q2, respectively. The flip-flops 620 and 630 receive data signals 640 and 645 at D1 and D2, clock signals 810 and 820 at CLK1 and CLK2, and output signals 660 and 665 at Q1 and Q2, respectively. The clock signals 810 and 820 are derived using the delay elements neg ts1 and neg ts2 by applying the enhanced NCC algorithm of the present invention. The flip-flops 620 and 630 store the data signals 640 and 645 received at the data input terminals D1 and D2 during rising edges of the clock signals 810 and 820 received at the clock input terminals CLK1 and CLK2, respectively. As shown in FIG. 8, the enhanced NCC algorithm of the present invention applies the delay elements neg ts1 and neg ts2 to the clock signals 810 and 820 received at both the clock input terminals CLK1 and CLK2, respectively, which results in an expected implementation of the path delays during simulation.

It can be seen from the above described examples, that the NCC algorithm applies the NCC to all the constraints (setup and hold timing constraints) and all the path delays of the digital logic element, which results in the unexpected implementation of path delays and duty-cycle distortions. Whereas the enhanced NCC algorithm of the present invention applies the NCC to all the constraints and path delays after grouping the constraints such that the constraints affect only the outputs referred to in the path delays.

The following example further illustrates, with reference to FIG. 8, the grouping of the constraints and the application of the NCC by the enhanced NCC algorithm of the present invention. The grouping of the constraints and path delays by using the enhanced NCC algorithm results in the following two groups:

Group 1 for Output Pin Q1
D1-to-CLK setup (ts1)
D1-to-CLK hold (th1)
CLK-to-Q1 propagation delay
Group 2 for Output Pin Q2
D2-to-CLK setup (ts2)
D2-to-CLK hold (th2)
CLK-to-Q2 propagation delay It can be seen from the above grouping that the constraint D2 to CLK (setup/hold) does not affect Q1 and further D1-to-CLK (setup/hold) does not affect Q2. It can also be seen from the above example that the enhanced NCC algorithm applies NCC independently to both the groups 1 and 2. For pins common to two or more groups, the delay buffers are added for each group as shown in FIG. 8 to alleviate the incorrect application of path delays.

Again, using the example constraints and path delays the application of the NCC using the enhanced NCC algorithm to two or more grouped constraints is illustrated below:

When ts (D1-CLK)=4, th (D1-CLK)=7, ts (D2-CLK)=−6, th (D2-CLK)=14, CLK-to-Q1=5, and CLK-to-Q2=15, application of the enhanced algorithm results in following groups:

Group 1
ts (D1-CLK)=4
th (D1-CLK)=7
CLK-to-Q1 propagation delay=5
Group 2
ts (D2-CLK)=−6 th (D2-CLK)=14
CLK-to-Q2 propagation delay=15

Applying the NCC using the enhanced NCC algorithm to Group 1 does not affect the path delay since there are no negative constraints in Group 1. Applying the NCC using the enhanced NCC algorithm to Group 2 adjusts the constraints and path delays by adding a delay buffer of 6 time units on CLK since there is a negative constraint. Finally, applying the NCC using the enhanced NCC algorithm to the Group 2 results in adjusting the constraints and path delays as follows:

ts (D2-CLK)=0
th (D2-CLK)=8
CLK-to-Q2 propagation delay=9

The above adjustments to the constraints and path delays of Group 2 result in an accurate simulation. Further, applying the above example constraints and path delays shows that the duty-cycle distortion is also alleviated.

Figure 9:
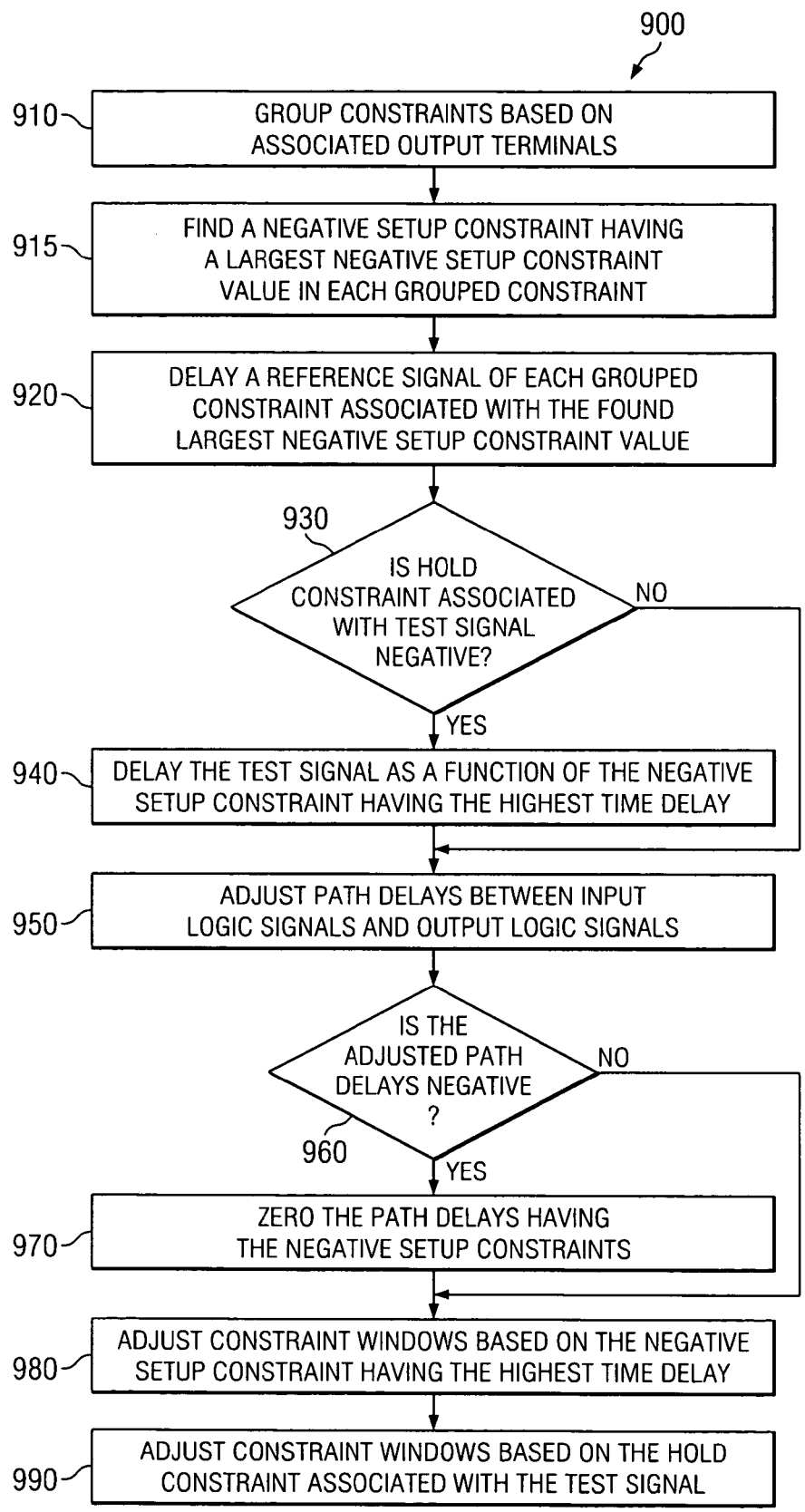
FIG. 9 is a flowchart illustrating an example application of the NCC using an enhanced NCC algorithm of the present invention.

FIG. 9 is a flowchart illustrating an example embodiment of a method 900 of application of the enhanced NCC algorithm according to the present subject matter. At 910, the method 900 in this example embodiment groups constraints based on associated output logic signals in a logic circuit. The logic circuit can be a digital logic circuit. The digital logic circuit is a sequential logic circuit, such as a register, a flip-flop, and so on. In some embodiments, the constraints are grouped based on associated output terminals in the digital logic circuit. The constraints can be timing constraints. The timing constraints can be setup time constraints, hold time constraints, and so on.

At 915, a negative setup constraint having a largest negative setup constraint value is found in each grouped constraints. At 920, a reference signal of each grouped constraint associated with the found largest negative setup constraint value is delayed. In some embodiments, the reference signal is a clock signal.

A hold constraint associated with a test signal is checked whether it is a negative constraint at 930. The test signal can be a data signal, address signal, or a control signal. If the hold constraint associated with the test signal is a negative constraint, then the test signal is delayed as a function of the negative setup constraint having the largest negative setup constraint value and the hold constraint between the test and reference signals at 940.

At 950, path delays are adjusted between input logic signals and the output logic signals. At 960, adjusted path delays are checked for negative path delays. At 970, path delays are zeroed, if the path delays are negative. At 980, constraint windows are adjusted based on the negative setup constraint having the largest negative setup constraint value. If the path delays are not negative, the method 900 goes to act 980. Further, the constraint windows are adjusted based on the hold constraint associated with the test signal at 990. Each of the above acts is explained in more detail with reference to FIGS. 6-8.

Although the method 900 includes acts 910-990 that are arranged serially in the exemplary embodiments, other embodiments of the present subject matter may execute two or more acts in parallel, using multiple processors or a single processor organized in two or more virtual machines or sub-processors. Moreover, still other embodiments may implement the acts as two or more specific interconnected hardware modules with related control and data signals communicated between and through the modules, or as portions of an application-specific integrated circuit. Thus, the exemplary process flow diagrams are applicable to software, firmware, and/or hardware implementations.

Various embodiments of the present invention can be implemented in software, which may be run in the environment shown in FIG. 10 (to be described below) or in any other suitable computing environment. The embodiments of the present invention are operable in a number of general-purpose or special-purpose computing environments. Some computing environments include personal computers, general-purpose computers, server computers, hand-held devices (including, but not limited to, telephones and personal digital assistants of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present invention may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 10:
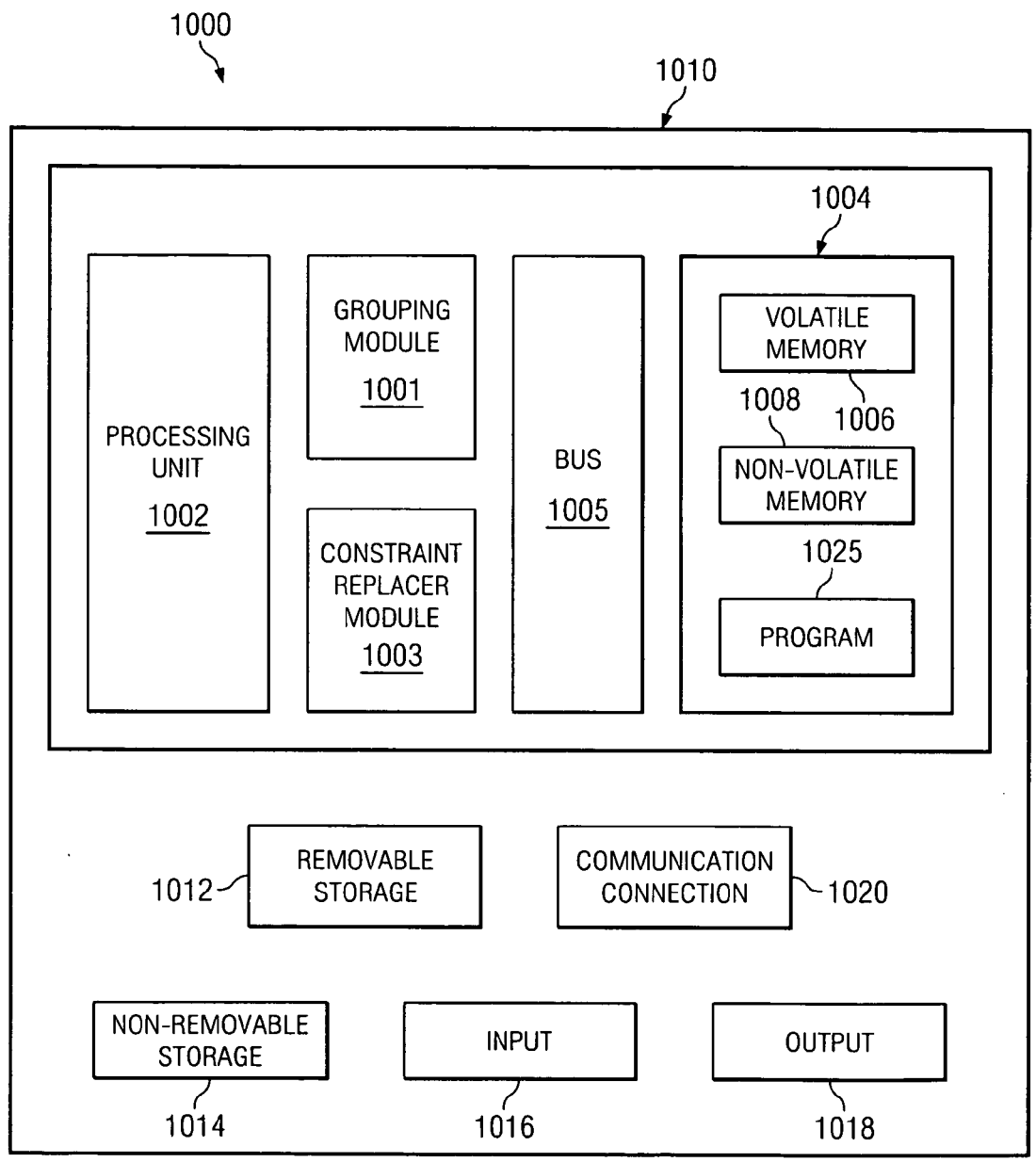
FIG. 10 is an example of a suitable computing environment for implementing embodiments of the present invention.

FIG. 10 shows an example of a suitable computing system environment for implementing embodiments of the present invention. FIG. 10 and the following discussion are intended to provide a brief, general description of a suitable computing environment in which certain embodiments of the inventive concepts contained herein may be implemented.

A general computing device, in the form of a computer 1010, may include a processing unit 1002, memory 1004, removable storage 1012, and non-removable storage 1014. Computer 1010 additionally includes a bus 1005, a grouping module 1001, and a constraint replacer module 1003.

Computer 1010 may include or have access to a computing environment that includes one or more input elements 1016, one or more output elements 1018, and one or more communication connections 1020 such as a network interface card or a USB connection. The computer 1010 may operate in a networked environment using the communication connection 1020 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 1004 may include volatile memory 1006 and non-volatile memory 1008. A variety of computer-readable media may be stored in and accessed from the memory elements of computer 1010, such as volatile memory 1006 and non-volatile memory 1008, removable storage 1012 and non-removable storage 1014. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present invention may be implemented in conjunction with program modules, including functions, procedures, data structures, application programs, etc., for performing tasks, or defining abstract data types or low-level hardware contexts.

Embodiments of the invention may be implemented in conjunction with program modules, including functions, procedures, data structures, application programs, etc., for performing tasks, or defining abstract data types or low-level hardware contexts. Program modules, such as grouping module 1001 and constraint replacer module 1003, may be stored in memory 1004 and associated storage media of the type(s) mentioned above.

Machine-readable instructions stored on any of the above-mentioned storage media are executable by the processing unit 1002 of the computer 1010. For example, a computer program 1025 may comprise machine-readable instructions capable of applying the enhanced NCC algorithm during an event driven simulation according to the teachings and herein described embodiments of the present invention. In one embodiment, the computer program 1025 may be included on a CD-ROM and loaded from the CD-ROM to a hard drive in non-volatile memory 1008. The machine-readable instructions cause the computer 1010 to apply the enhanced NCC algorithm according to embodiments of the present invention. In these embodiments, the grouping module 1001 groups constraints based on associated output terminals in a digital logic circuit. The constraint replacer module 1003 then replaces negative constraints with positive constraints, such that the path delays in the grouped constraints are not altered, by applying a negative constraint calculation to correct for path delays and duty cycle distortions during an event simulation.

The above description is intended to be illustrative, and not restrictive. Many other embodiments will be apparent to those skilled in the art. The scope of the invention should therefore be determined by the appended claims, along with the full scope of equivalents to which such claims are entitled.

CONCLUSION

The above-described methods and apparatus provide various embodiments to enable accurate timing and functional verification in a NCC implement event-driven logic simulators when there are negative constraints in logic elements.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, a circuit, a system, and an article comprising a machine-accessible medium having associated instructions.

Other embodiments will be readily apparent to those of ordinary skill in the art. The elements, algorithms, and sequence of operations can all be varied to suit particular requirements. The operations described above with respect to the method illustrated in FIG. 9 can be performed in a different order from those shown and described herein.

FIGS. 1, 4, 6, 8 and 10 are merely representational and are not drawn to scale. Certain proportions thereof may be exaggerated, while others may be minimized. FIGS. 1-10 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The invention claimed is:

1. An apparatus storing a computer program for applying an algorithm in an event driven simulation, comprising:
    means for grouping constraints based on associated output logic signals in a logic circuit;
    means for finding a negative setup constraint having a largest negative setup constraint value in each grouped constraint; and
    means for delaying a reference signal of each grouped constraint associated with the found largest negative setup constraint value.

2. The apparatus of claim 1, further comprising:
    means for delaying a test signal as a function of the negative setup constraint having the largest negative constraint value and a hold constraint when the hold constraint associated with the test signal is negative.

3. The apparatus of claim 2, further comprising:
    means for adjusting path delays between input logic signals and the output logic signals;
    means for checking adjusted path delays for negative setup constraints; and
    means for zeroing the path delays having the negative setup constraints.

4. The apparatus of claim 3, further comprising:
    means for adjusting constraint windows based on the negative setup constraint having the largest negative setup constraint value.

5. The apparatus of claim 3, further comprising:
    means for adjusting constraint window based on the hold constraint associated with the test signal.

* * * * *